US012563980B2

(12) United States Patent

Peethala et al.

(10) Patent No.: US 12,563,980 B2
(45) Date of Patent: Feb. 24, 2026

(54) SELECTIVE DEPOSITION AND CROSS-LINKING OF POLYMERIC DIELECTRIC MATERIAL

(71) Applicant: International Business Machines Corporation, Armonk, NY (US)

(72) Inventors: Cornelius Brown Peethala, Slingerlands, NY (US); Rudy J. Wojtecki, San Jose, CA (US); Son Nguyen, Schenectady, NY (US); Balasubramanian S. Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 836 days.

(21) Appl. No.: 17/586,757

(22) Filed: Jan. 27, 2022

(65) Prior Publication Data

US 2023/0238236 A1     Jul. 27, 2023

(51) Int. Cl.
*H01L 21/02*        (2006.01)
*H01L 23/522*       (2006.01)

(52) U.S. Cl.
CPC .................. *H01L 21/02263* (2013.01); *H01L 21/02118* (2013.01); *H01L 23/5226* (2013.01)

(58) Field of Classification Search
CPC ......... H01L 21/02263; H01L 21/02118; H01L 23/5226
USPC ......................................................... 438/765
See application file for complete search history.

(56) References Cited

U.S. PATENT DOCUMENTS

| | | | |
|---|---|---|---|
| 7,368,377 B2 | 5/2008 | Whelan | |
| 9,362,231 B2 | 6/2016 | Chiang | |
| 11,171,054 B2 | 11/2021 | Nguyen | |
| 11,177,232 B2 * | 11/2021 | Nad .................. | H01L 23/53238 |
| 2006/0228886 A1 | 10/2006 | Zhang | |

FOREIGN PATENT DOCUMENTS

WO          20161789781 W      11/2016

OTHER PUBLICATIONS

Au, Y., Lin, Y., Kim, H., Beh, E., Liu, Y., & Gordon, R. G. (2010). Selective chemical vapor deposition of manganese self-aligned capping layer for Cu interconnections in microelectronics. Journal of the Electrochemical Society, 157(6), D341.

Cheng, Y. L., Haung, C. W., Lee, C. Y., Chen, G. S., & Fang, J. S. (2019). Self-assembled monolayers on highly porous low-k dielectrics by 3-aminopropyltrimethoxysilane treatment. Coatings, 9(4), 246.

(Continued)

*Primary Examiner* — Tu-Tu V Ho
(74) *Attorney, Agent, or Firm* — L. Jeffrey Kelly; Otterstedt & Kammer PLLC

(57) ABSTRACT

An exemplary semiconductor structure includes a semiconductor substrate; a plurality of metal lines on top of the semiconductor substrate, each line having a line width 5 nanometers or less: a plurality of dielectric features adjacent to the metal lines; and a plurality of metal vias on top of the metal lines. Out of a random sample of 1000 vias at least 950 vias are fully-aligned to corresponding metal lines.

7 Claims, 8 Drawing Sheets

100

(56) References Cited

OTHER PUBLICATIONS

Roy, U., Khaderbad, M. A., Yedukondalu, M., Walawalkar, M. G., Ravikanth, M., Mukherji, S., & Rao, V. R. (Jun. 2009). Hydroxy-phenyl Zn (II) porphyrin self-assembled monolayer as a diffusion barrier for copper-low k interconnect technology. In 2009 2nd International Workshop on Electron Devices and Semiconductor Technology (pp. 1-5). IEEE.

Sangermano, M., & Nappo, G. (2018-2019). Passivation of metals (Co, Cu) with Self-Assembled Monolayers for area-selective Atomic Layer Deposition. Politecnico di Torino, Corso di laurea magistrale in Ingegneria Dei Materiali.

Hashemi, "Area Selective Atomic Layer Deposition of Metal Oxides on Metal-Dielectric Patterns." Stanford Univ. Aug. 2016, pp. 1-261.

Nguyen, "Selective deposition of AlOx for Fully Aligned via in nano Cu interconnects." IEEE International Interconnect Technology Conference (IITC) Jul. 6, 2021, pp. 1-2.

Chen, "Fully self-Aligned via integration for interconnect scaling beyond 3 nm node." IEDM Proc., Dec. 2021. pp. 486-489.

Briggs et al., "Process Challenges in Fully Aligned Via Integration for sub 32 nm Pitch BEOL", 2018 IEEE International Interconnect Technology Conference (IITC), Jun. 2018, 05 pages.

Grill et al., "Progress in the development and understanding of advanced low k and ultralow k dielectrics for very largescale integrated interconnects-State of the art", Applied Physics Review, Jan. 15, 2014, 18 pages.

Guo Lei "Selective Chemistry of Metal Oxide Atomic Layer Deposition on Si Based Substrate Surfaces", Mar. 2015, 120 Pages.

\* cited by examiner

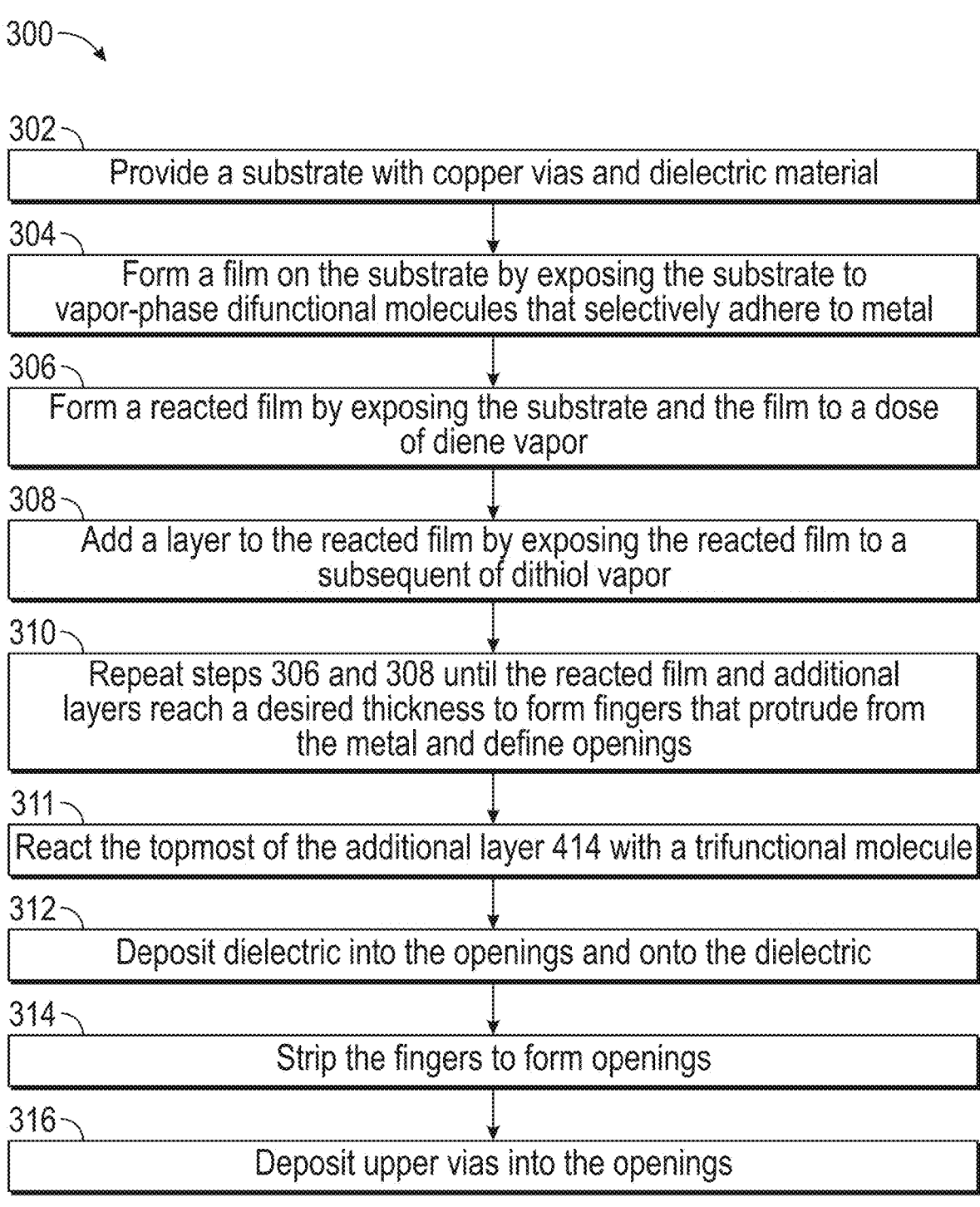

300

302
Provide a substrate with copper vias and dielectric material

304
Form a film on the substrate by exposing the substrate to vapor-phase difunctional molecules that selectively adhere to metal 306
Form a reacted film by exposing the substrate and the film to a dose of diene vapor 308
Add a layer to the reacted film by exposing the reacted film to a subsequent of dithiol vapor 310
Repeat steps 306 and 308 until the reacted film and additional layers reach a desired thickness to form fingers that protrude from the metal and define openings 311
React the topmost of the additional layer 414 with a trifunctional molecule 312
Deposit dielectric into the openings and onto the dielectric 314
Strip the fingers to form openings 316
Deposit upper vias into the openings

SELECTIVE DEPOSITION AND CROSS-LINKING OF POLYMERIC DIELECTRIC MATERIAL

BACKGROUND

The present invention relates to the electronic, metallurgic, and chemical arts, and more specifically, to semiconductor device fabrication.

At current and future fabrication process nodes, subtractive processes such as photolithography are prone to errors in alignment between layers. These errors can lead to performance problems such as vias unexpectedly shorting between components. Additive processes, such as selective deposition of dielectrics, have been proposed to avoid alignment errors. Currently known methods for selective deposition of dielectric material are limited in the achievable thickness of a dielectric layer. The thickness limits are driven by factors such as spillover from a selectively deposited layer onto adjacent structures.

SUMMARY

Principles of the invention provide techniques for selective deposition and cross-linking of polymeric dielectric material. In one aspect, an exemplary method includes forming a self-assembled monolayer (SAM) film by delivering, to a substrate that comprises a metal region and a dielectric region, a first quantity of difunctional molecules that selectively adhere to the metal region. The method also includes forming a reacted film by delivering a second quantity of diene molecules to active sites of the SAM film, under conditions that promote reaction of the diene molecules with the SAM film; grafting a further layer to the reacted film by delivering a third quantity of difunctional molecules to the reacted film, under conditions that promote reaction of the difunctional molecules with the reacted film; and cross-linking free ends of the further layer by delivering a fourth quantity of trifunctional molecules to the further layer, under conditions that promote reaction of the trifunctional molecules with the further layer.

According to another aspect, an exemplary structure includes a metal line; a dielectric feature adjacent to the metal line; and a film of organic material on top of the metal line. A thickness of the film is greater than a width of the metal line and the film does not overlap the dielectric feature.

According to another aspect, an exemplary semiconductor structure includes a semiconductor substrate; a plurality of metal lines on top of the semiconductor substrate, each line having a line width 5 nanometers or less: a plurality of dielectric features adjacent to the metal lines; and a plurality of metal vias on top of the metal lines. Out of a random sample of 1000 vias at least 950 vias are fully-aligned to corresponding metal lines.

In view of the foregoing, techniques of the present invention can provide substantial beneficial technical effects. For example, one or more embodiments provide one or more of:

Selectively growing low-k dielectric greater than 4 nanometers thick on metal/dielectric substrate using a vapor deposited self-assembled monolayer (SAM), without significant spillover onto adjacent structures.

Depositing a self-assembled monolayer in multiple iterative steps.

Lateral cross-linking of long chain SAMs and partial selective dielectric growth (SiCOH or other organosilicon SAM) using flowable chemical vapor deposition (FCVD), ultraviolet (UV) cure, and chemical mechanical polishing (CMP) with minimal lateral growth for fully-aligned via (FAV) structures and other back end of line (BEOL) nano fabrication applications.

Crosslinked SAMs are shown to improve selectivity to reduce defects (nucleation sites) from a selective deposition. This may ensure better performance and reliability of a device generated with this process or allow one to deposit a selective film thicker than one could without a crosslinked SAM.

Some embodiments may not have these potential advantages and these potential advantages are not necessarily required of all embodiments. These and other features and advantages of the present invention will become apparent from the following detailed description of illustrative embodiments thereof, which is to be read in connection with the accompanying drawings.

BRIEF DESCRIPTION OF THE DRAWINGS

FIG. 2 depicts steps of a method for selectively depositing dielectric material, according to an exemplary embodiment.

DETAILED DESCRIPTION

Modern semiconductor devices have multiple layers of transistors and other components. Metal vias electrically connect the layers of semiconductor devices. It is desirable to produce semiconductor devices in which the metal vias and lines are aligned between layers. Misalignment of vias and lines can result in poor performance of a device.

Figure 11:
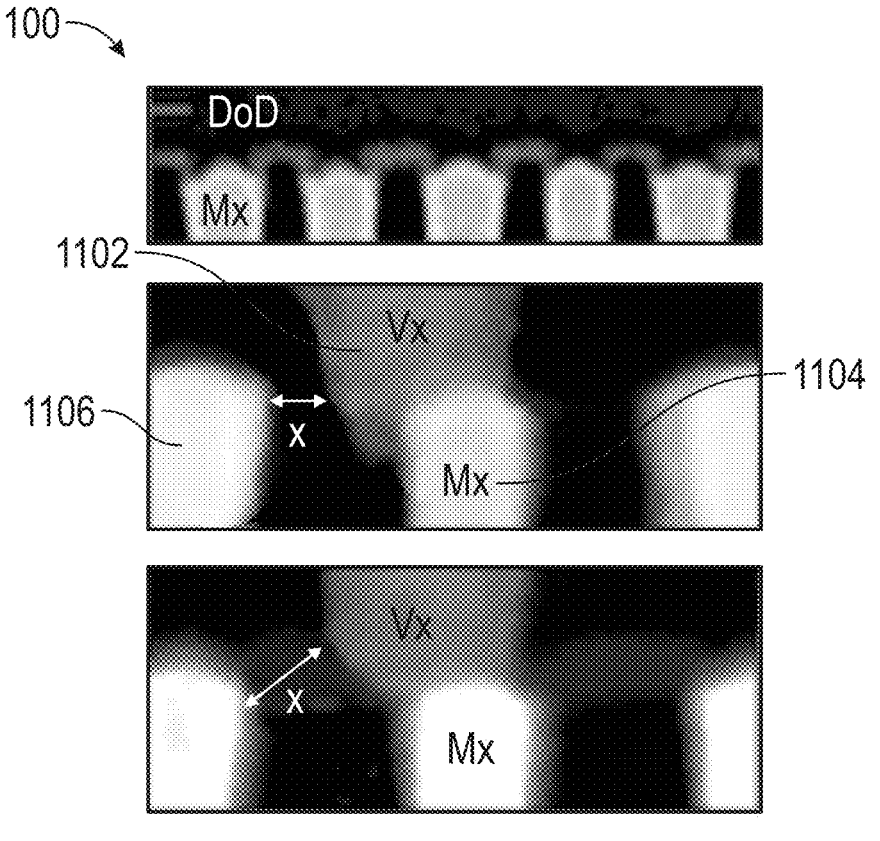
FIG. 11 depicts a micrograph of a partially finished semiconductor structure fabricated according to conventional subtractive processes.

Currently, subtractive processes such as photolithography are used to form trenches and vias in an interlayer dielectric at the back-end-of-line (BEOL) stages of fabrication. As mentioned above, subtractive processes present a risk of misalignment, for example, when double or quadruple patterns are used for smaller feature sizes the misalignment risk increases. FIG. 11 depicts a semiconductor structure 1100, formed by conventional subtractive processes, in which a via 1102 oversteps the edge of a metal line 1104 and approaches another metal line 1106, possibly exceeding a minimum distance constraint between metals. At feature sizes less than 5 nanometers, according to future fabrication process nodes, a proportion of misaligned vias can be as much as about 50% or 500 out of a random sample of 1000 vias.

Researchers have proposed additive masking processes, in which self-aligned molecules/self-assembled monolayers/ surface-aligned molecules (SAMs) are vapor-deposited onto a surface with metal vias and dielectric structures separating the vias. The SAMs then are used to guide and constrain deposition of interlayer dielectric material. Physical and chemical properties of the SAMs limit achievable layer thickness. Generally, monomer chain length of a SAM determines its maximum layer thickness. For example, a SAM that is 12 carbon atoms long can be deposited to a maximum layer thickness of about 1.85 nanometers (nm) with minimal lateral spill over. Vapor deposition process parameters and chemical properties of the SAMs limit how long a SAM can be deposited. As SAM length increases, its vapor pressure at a given temperature tends to decrease. A minimum vapor pressure is needed to attain adequate deposition rates by physical vapor deposition (PVD). Vapor pressure can be increased by raising temperature—up to a certain temperature, at which a SAM will self-react and dimerize, abruptly lowering its vapor pressure. Typically, for SAMs greater than 12 carbon atoms long, adequate vapor pressure cannot be achieved before the process temperature exceeds the dimerization temperature.

For a given SAM layer thickness, a dielectric that is isotropically deposited next to the SAM will begin to "mushroom" or spill over on top of the SAM once layer thickness of the dielectric exceeds layer thickness of the SAM. For process nodes on the micrometer scale, such as are encountered in university research settings, in which feature width is an order of magnitude greater than layer thickness, spill-over of the dielectric does not entirely cover the SAM. However, for industrial process nodes on the small nanometer scale, where feature width is the same order of magnitude as layer thickness, spill-over can completely obscure or encapsulate the SAM. Total spill-over renders the SAM masking pointless, because subtractive fabrication processes then are needed to remove the spill-over, and such processes present the potential for misalignment that the SAM masking tries to mitigate.

Thiol chains are examples of SAMs that adhere selectively to metals (such as the copper of a typical via) rather than to oxides (such as a typical dielectric). However, thiols greater than about 12 carbon atoms in length are unsuitable for vapor deposition because they have higher boiling points (making uniform deposition more difficult) and generally tend to dimerize before they can be heated to a high enough temperature to produce adequate vapor pressure for deposition. Because thiol chains adhere to a surface only at their single functional end, their maximum length for vapor deposition limits the maximum layer thickness achievable with them. An aspect of the invention is an understanding that difunctional molecules, e.g., dithiol chains, have two functional ends, so that free ends of an initial deposited layer or film advantageously can be reacted first with another chemical (e.g., a diene) and then with a further difunctional molecule (e.g., dithiol) to adhere a subsequent layer or film. Suitable difunctional molecules include, in one or more embodiments, (propane-1,3 dithiol) and 1,6-heptadiene.

Figure 1:
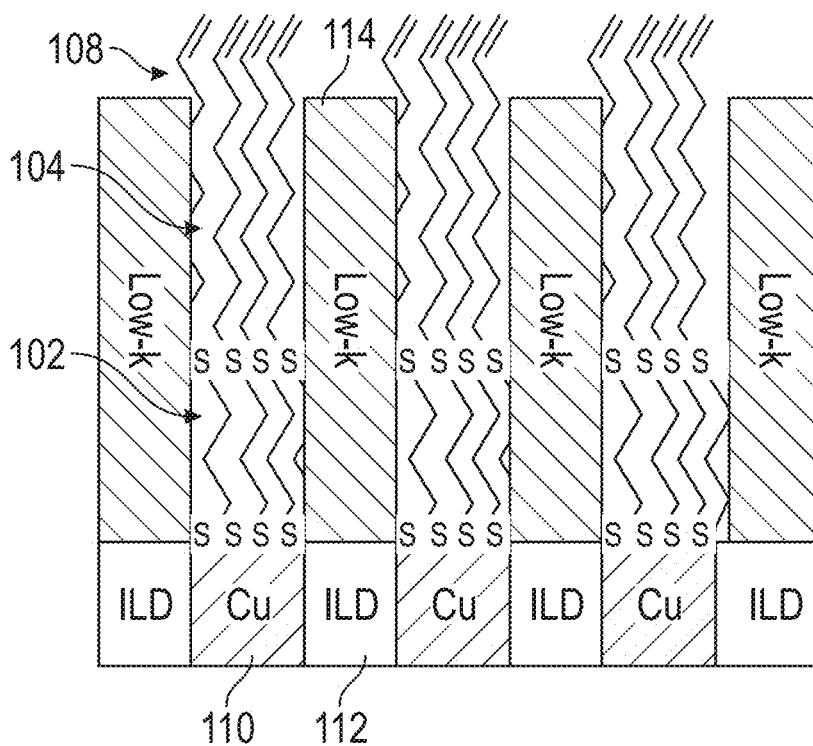
FIG. 1 shows a partially finished semiconductor structure, according to an exemplary embodiment, in which a plurality of self-assembled monolayers (SAMs) have been built up into a film.

FIG. 1 shows a partially finished semiconductor structure 100, according to an exemplary embodiment, in which a plurality of SAMs 102, 104 have been built up into a film 108 on a metal substrate portion 110 between two dielectric substrate portions 112. A dielectric layer 114 (in one or more embodiments, a low-k dielectric) then is deposited in the spaces adjacent to the SAM film 108.

According to one or more embodiments of the invention, an iterative process grows a SAM layer to thicknesses more than feature width, e.g., thicknesses exceeding 4 nanometers (nm)—and in some cases, exceeding 10 nm—without spill-over of the SAM layer onto adjacent features. Thereby, significantly improved alignment of vias to metal lines advantageously is achieved. For example, in one or more embodiments, out of a random sample of 1000 vias on a chip, at least 950 are fully-aligned to corresponding metal lines. Furthermore, in one or more embodiments, at least 990 of 1000 random-sampled vias are fully-aligned. Furthermore in this regard, in one or more embodiments 95% or even 99% of vias on a chip are fully-aligned to corresponding metal lines. Because of the extraordinarily large number of vias on a modern integrated circuit chip, it is not feasible to measure the alignment of every via. Thus, the percentages can be determined by measuring a randomly selected statistically valid sample (say, 1000) of vias. Advantageously, cyclic, or iterative deposition of a SAM, followed by a cross-linker molecule, promotes vertical growth of a long chain polymer for larger layer thicknesses in which the polymers are stiffened against horizontal spill-over by van der Waals forces and/or crosslinking at functional ends of the constituent monomers. Advantageously, iterative, or cyclic SAM grafting and then cross-linking by thermal and/or ultraviolet (UV) cure forms stable and stiff SAM covering metal lines with thickness greater than feature width. Following the iterative grafting or deposition, partial planarization is achieved by selective deposition of SiCOH or other organosilicon (exemplary low-k dielectric) onto dielectric features, using flowable chemical vapor deposition (FCVD) at 80° C. then UV cure at 200-300° C. Selective SiCOH can be formed by long chain cross-linked organosilicon SAM and UV cure. Then chemical mechanical polishing (CMP) removes excess FCVD SiCOH. Next, the SAM is selectively removed, e.g., by hydrogen plasma wash, to form a fully-aligned via (FAV) structure.

Generally, SAMs have three types. Type 1 SAMs have short and wide tails with one bonding site at one end for attaching to a surface on which the SAM is deposited. Type 2 SAMs have short and narrow tails with two bonding sites at one end. Type 1 or Type 2 SAMs tend to flop over sideways when they adhere to a surface at their bonding sites. On the other hand, Type 3 SAMs have a relatively long and narrow tail, with three bonding sites at one end. The three bonding sites form a sort of tripod that helps stabilize the tail protruding outward from the surface. Thus, using a Type 3 SAM minimizes/prevents lateral growth, and cross-linking will further stabilize and prevent SAM flop down. Suitable Type 3 SAMs include, e.g., 4-(2-propen-1-yl)-1,6-Heptadiene, 3,3-diethenyl-1,4-Pentadiene, or methanetrithiol.

FIG. 2 depicts steps of a method 300 for selectively depositing dielectric material, according to an exemplary embodiment. FIG. 3 through FIG. 9 depict schematics of selective difunctional self-assembled monolayer (SAM) deposition, according to the method of FIG. 2.

Figures 3, 4:
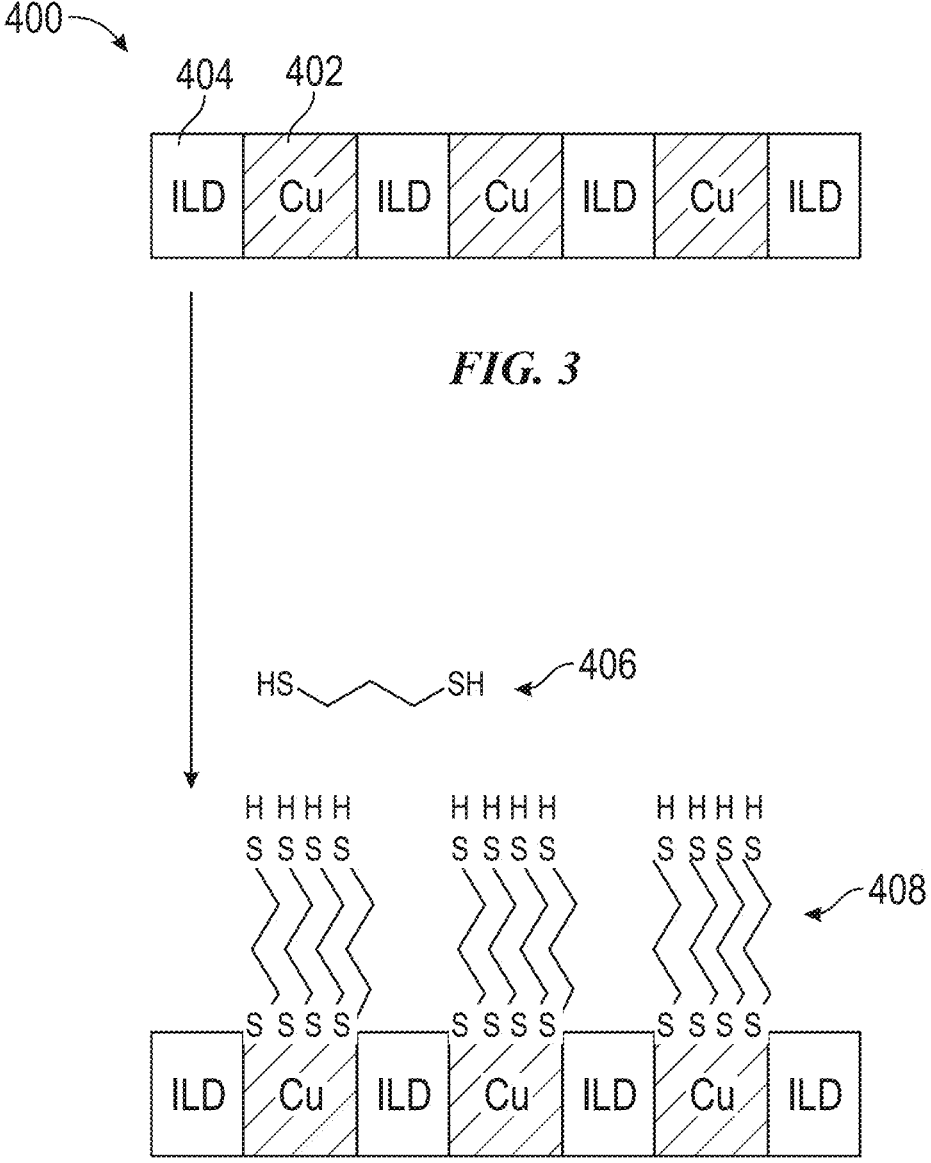
FIG. 3 through FIG. 9 depict schematics of selective difunctional self-assembled monolayer (SAM) deposition, according to the method of FIG. 2.

At 302, provide a substrate 400 with copper vias 402 that are separated by dielectric material 404, as shown in FIG. 3. At 304, expose the substrate 400 to vapor-phase difunctional molecules 406 that selectively adhere to metal (e.g., dithiol chains). In one or more embodiments, the dithiol chains are not more than 8 carbon atoms in length. Advantageously, keeping the dithiol chains relatively short enables performing the process at relatively low temperatures, e.g., on the order of less than 200° C. At higher temperatures, dithiols will dimerize, so that it becomes difficult to vaporize them sufficiently quickly to support acceptable deposition rates. Advantageously, the dithiols adhere selectively to metal (i.e., the copper vias 402) but not to oxide or nitride (i.e., the dielectric material 404), thereby forming a selective film 408 as shown in FIG. 4. In one or more embodiments, the dithiol vapor is provided to achieve a saturated surface film in which the dithiol molecules are closely packed, i.e., the surface is exposed for more than one second up to about thirty seconds, in a self-limiting reaction. The saturated film 408 of dithiol chains keep each other protruding outward from the copper vias 402. Therefore, a film built up from the deposited dithiol chains protrudes outward from the vias but leaves the dielectric material exposed.

Figures 5, 6:
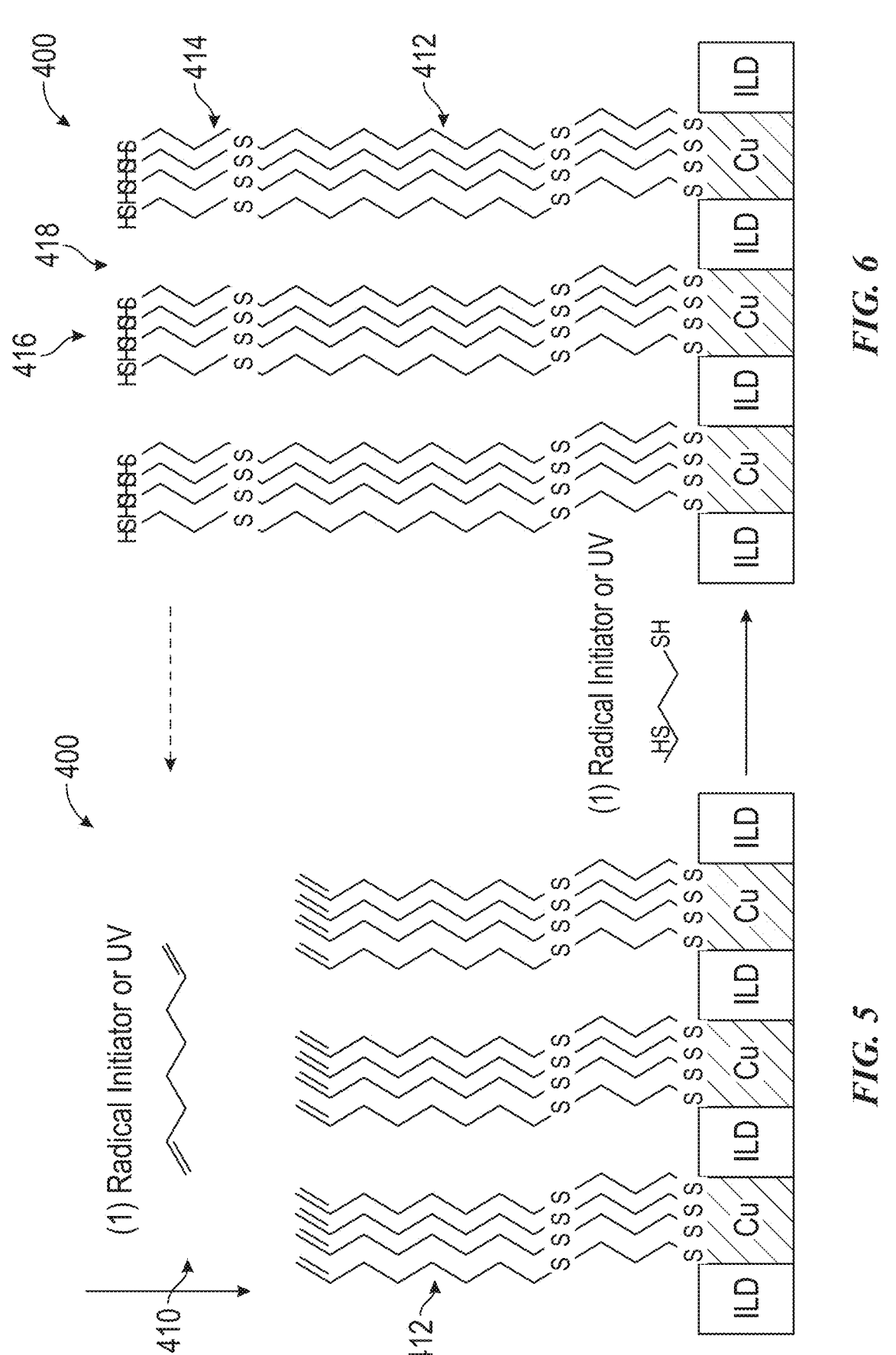

At 306, expose the substrate 400 and the film 408 to a dose of diene vapor 410, which reacts with the exposed functional ends of the dithiol chains to promote van der Waals interactions and form a reacted film 412, in an intermediate structure 500, as shown in FIG. 5. Advantageously, the van der Waals interactions between hydrogens of adjacent dithiol chains stiffen the film and promote anisotropic growth straight outward from the vias. Advantageously, the dithiol-diene reaction is very well controlled and predictable at process conditions. This promotes accurate deposition of a desired layer thickness. Additionally, the dithiol-diene reaction prepares the free ends of the dithiol chains to bond with additional chains.

At 308, expose the reacted film 412 to a subsequent dose of dithiol vapor. Molecules from the subsequent dose adhere to the free ends of the dithiol chains protruding from the metal vias, thereby adding an additional layer 414 to the reacted film 412 in an intermediate structure 600, as shown in FIG. 6.

At 310, repeat steps 306 and 308 until the reacted film 412 and additional layers 414 reach a desired thickness to form fingers 416 that protrude from the metal vias 402 and define openings 418, as in the intermediate structure 600.

Figure 10:
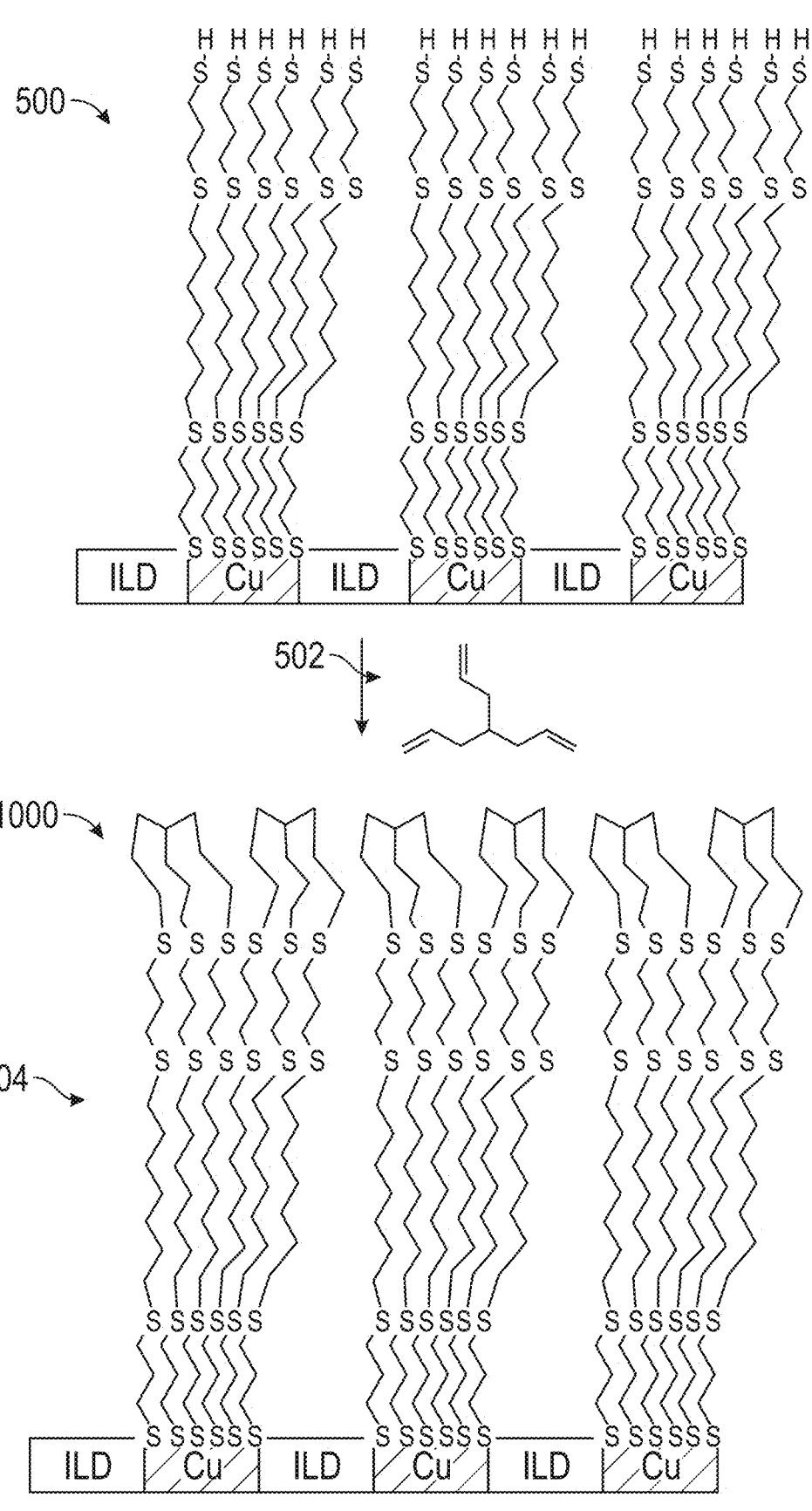
FIG. 10 depicts a schematic of crosslinking trifunctional SAMs, according to an exemplary embodiment.

At 311, optionally, react the topmost of the additional layers 414 with a trifunctional molecule 502, e.g., a suitable Type 3 SAM, in order to cross-link the upper ends of the dithiols so that they do not spill over. This reaction forms an intermediate structure 1000, as shown in FIG. 10.

Figure 7:
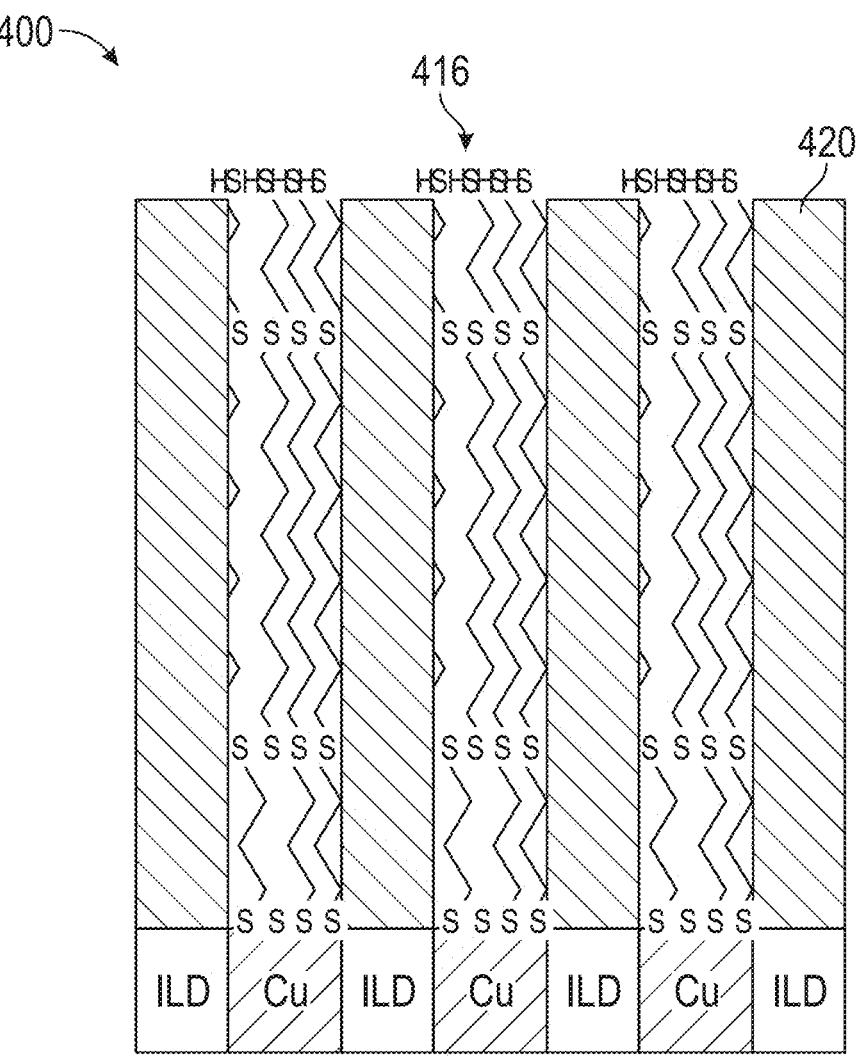

Then at 312, deposit dielectric 420 into the openings 418, and onto the dielectric 404, to form an intermediate structure 700, as shown in FIG. 7. The fingers 416 keep the dielectric 420 off the metal vias 402.

Figure 8:
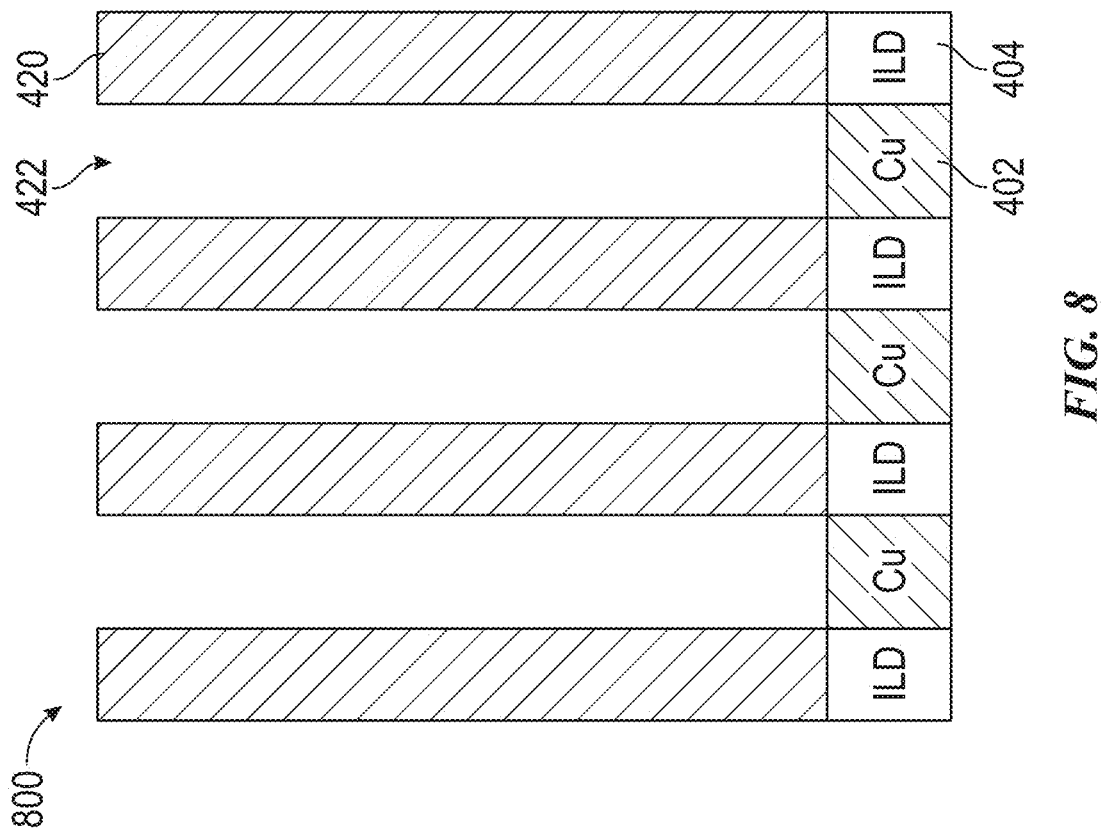

At 314, strip the fingers 416 (to form openings 422), in an intermediate structure 800 as shown in FIG. 8, by exposing them to, for example, a hydrogen or $NH_3$ plasma. Other suitable stripping solvents will be apparent to ordinary skilled workers.

Figure 9:
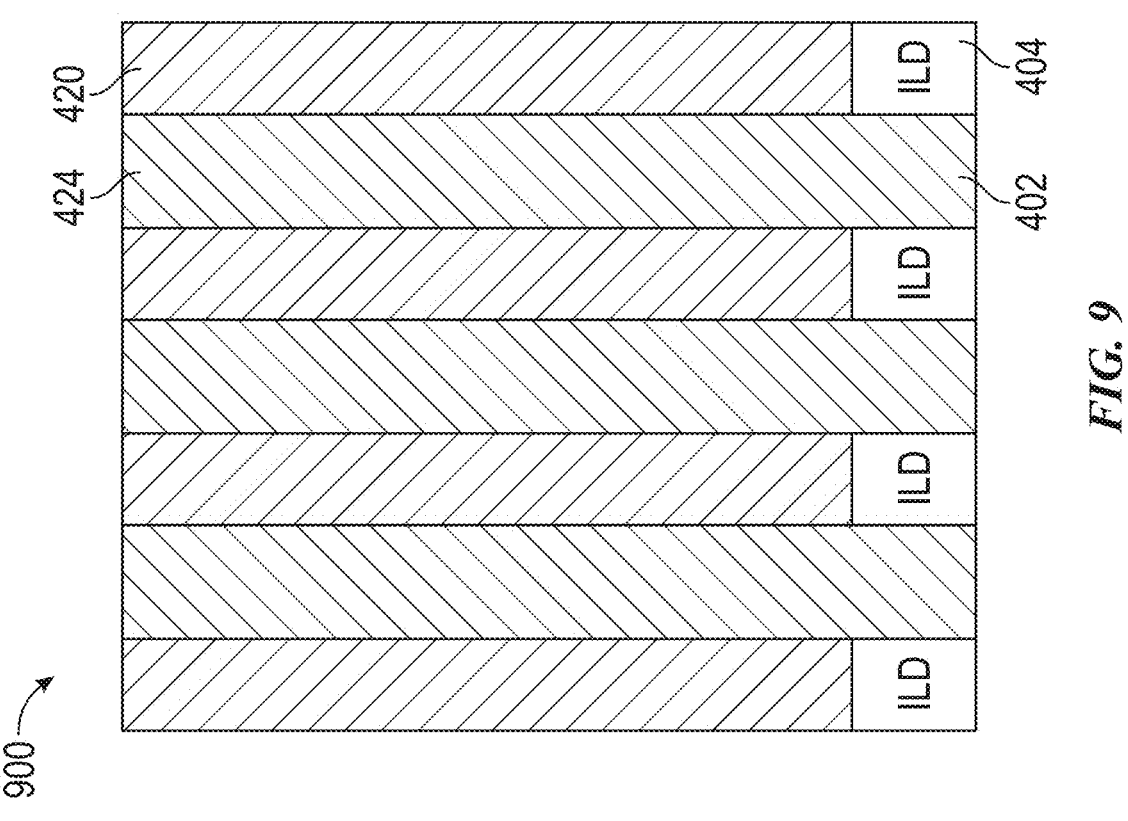
Figure 12:
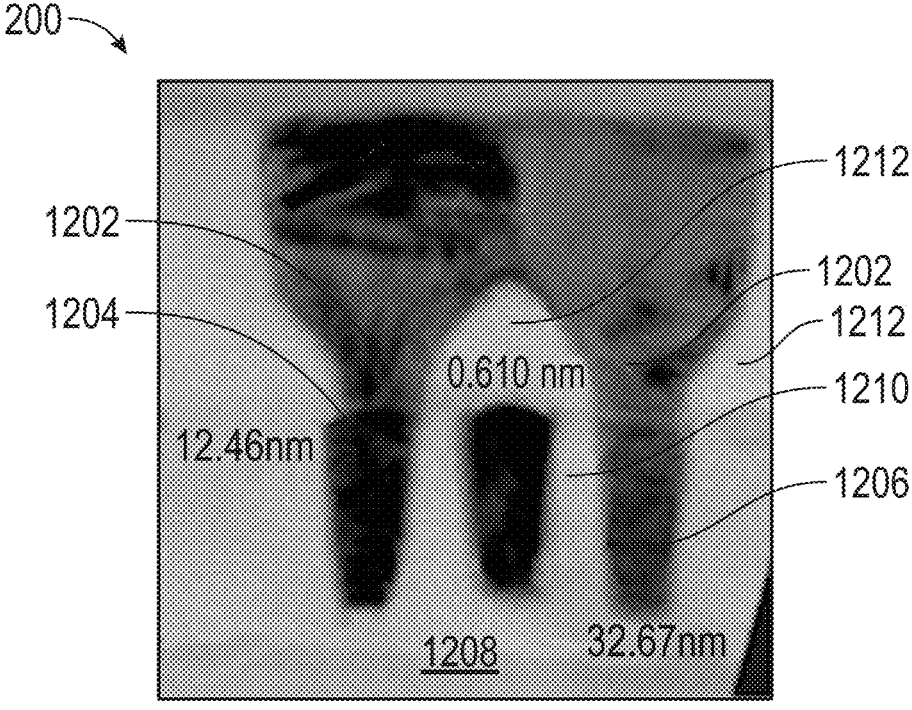
FIG. 12 depicts a micrograph of a partially finished semiconductor structure fabricated according to an exemplary embodiment.

At 316, deposit upper vias 424 into the openings 422, as shown in FIG. 9, to form structure 900. Because the openings 422 in the dielectric 420 are where the dithiol chains adhered to the metal vias 402 and formed the protruding fingers 416, the upper vias 424 will be well aligned to the metal vias 402. Consider FIG. 12, where a semiconductor structure 1200, prepared according to an exemplary embodiment, exhibits a via 1202 that is well-aligned to metal lines 1204, 1206 formed atop a substrate 1208 and separated by dielectric 1210. Thus, exemplary embodiments enable fabrication of a semiconductor structure in which each and every metal via is fully aligned to a corresponding metal line.

Advantageously, a well-packed SAM prevents SAM precursors from reaching (flopping over onto) the $SiO_2$ surface, where they could react with remaining Si—OH defects and Si—O—Si bonds. Such reactions would impair the vertical selective deposition of dielectric onto the $SiO_2$ surface.

Various difunctional SAM families are potentially useful in exemplary embodiments of the invention. Long chain SAMs (10-30 A) include many groups that can be bonded with branching, e.g., C—OH, COOH, Si—OH. For example, octadecanoic acid is a waxy solid at room temperature, with a chemical formula $C_{17}H_{35}CO_2H$. However, octadecanoic acid is unsuitable for vapor deposition due to its low vapor pressure at reasonable process temperatures. Stearic acid, palmitic acid, or hexadecenoic acid ($CH_3$ $(CH_2)_{14}COOH$) are other options. Generally, potentially useful SAMs include thiols (R—SH), silanes (R—SiCl$_3$), alkenes (R—C═C), alkanoic acids (R—COOH), and phosphonic acids (R—PO$_3$H$_3$). In general, the 8-12 carbon atom of R groups are the limit of mono or difunctional or trifunctional molecules to have sufficient vapor pressure for suitable SAM cyclic vapor deposition. Longer chain SAMs can be effectively deposited from liquid phase by being dissolved in a solvent and immersing the substrate in that solvent to get good surface functionalization. Certain aspects of the invention relate to tri-functional cross-linkable molecules being reacted with a previously deposited difunctional SAM to produce a SAM that is thicker and more rigid than a typical monofunctional SAM.

Some trifunctional SAM families are potentially useful in exemplary embodiments of the invention. FIG. 10 depicts a schematic of crosslinking a difunctional SAM film 500 with a trifunctional molecule 502, to produce a crosslinked SAM layer 504, according to an exemplary embodiment. Advantageously, crosslinking SAMs further stiffens the SAM layer beyond what is achieved with van der Waals interactions alone.

After deposition of the thick SAM layer, the dielectric surface can be selectively grown on SiO2 (or SiCOH) with cyclic organosilicon long chain molecules to minimize lateral growth. For example, octamethylcyclotetrasiloxane (OMCTS) or Tetramethylcycloterasiloxane (TCATS) could be used. CVD or ALD can be used for selective cyclic growth of the organosilicon molecules on top of surface, which also will lengthen the thickness of the dielectric with minimal lateral growth. The organosilicon can have crosslinking side chain group branching molecules for stable long chains.

Thus, for feature sizes (metal line widths) less than 14 nanometers (nm), embodiments of the invention enable fabrication of fully aligned vias with heights in excess of line width, e.g., in the case of lines smaller than 14 nm the vias can be more than 4 nm tall and still be fully aligned to the corresponding lines. In one or more embodiments, metal lines less than 14 nm in width can have vias more than 10 nm tall.

In one or more embodiments, as a characteristic of the fabrication process, a sulfur-containing residue will remain in the finished product at interfaces between the vias and the metal lines.

Given the discussion thus far, it will be appreciated that, in general terms, an exemplary method 300, according to an aspect of the invention, includes forming a self-assembled monolayer (SAM) film by, at 304, delivering, to a substrate that comprises a metal region and a dielectric region, a first quantity of difunctional molecules that selectively adhere to the metal region. The method also includes, at 306, forming a reacted film by delivering a second quantity of diene molecules to active sites of the SAM film, under conditions that promote reaction of the diene molecules with the SAM film; at 308, grafting a further layer to the reacted film by delivering a third quantity of difunctional molecules to the reacted film, under conditions that promote reaction of the difunctional molecules with the reacted film; and, at 311, cross-linking free ends of the further layer by delivering a fourth quantity of trifunctional molecules to the further layer, under conditions that promote reaction of the trifunctional molecules with the further layer.

In one or more embodiments, the difunctional molecules are selected from a list consisting of: dithiols (HS—R—SH), disilanes (Cl$_3$Si—R—SiCl$_3$), dialkenes (C=C—R—C=C), dialkanoic acids (HOOC—R—COOH), and diphosphonic acids (H$_3$PO$_3$—R—PO$_3$H$_3$).

In one or more embodiments, the method also includes, at 310, repeating steps of forming a reacted film and grafting a further layer at least one more time before the step of cross-linking free ends of the further layer. In one or more embodiments, the method include repeating steps of forming a reacted film and grafting a further layer until a thickness of an accumulated film can exceed a width of the metal region. In one or more embodiments, the width of the metal region is less than 14 nm. In one or more embodiments, the thickness of the film is greater than 10 nm and the film does not overlap the dielectric region. In one or more embodiments, a gap in the film is fully-aligned to the dielectric region and the film completely covers the metal region.

According to another aspect, an exemplary structure 600 includes a metal line 402; a dielectric feature 404 adjacent to the metal line; and a film 416 of organic material on top of the metal line. A thickness of the film is greater than a width of the metal line and the film does not overlap the dielectric feature. In one or more embodiments, the thickness of the film is in excess of 4 nanometers (nm). In one or more embodiments, the width of the metal line is less than 14 nm. In one or more embodiments, the thickness of the film is in excess of 10 nm. In one or more embodiments, a gap 418 in the film is fully-aligned to the dielectric region and the film completely covers the metal region.

According to another aspect, an exemplary semiconductor structure 1200 includes a semiconductor substrate 1208; a plurality of metal lines 1204, 1206 on top of the semiconductor substrate, each line having a line width 5 nanometers or less: a plurality of dielectric features 1210 adjacent to the metal lines; and a plurality of metal vias (e.g., metal via 1202) on top of the metal lines. Out of a random sample of 1000 vias at least 950 vias are fully-aligned to corresponding metal lines.

In one or more embodiments, each of the vias is taller than a width of the corresponding metal line.

In one or more embodiments, each of the metal lines is less than 14 nm wide. In one or more embodiments, each of the vias is more than 4 nm tall. In one or more embodiments, each of the vias is more than 10 nm tall.

In one or more embodiments, the structure 1200 also includes a sulfur-containing residue at interfaces between the vias and the metal lines.

In one or more embodiments, out of the random sample of 1000 vias at least 990 vias are fully-aligned to corresponding metal lines.

In one or more embodiments, the structure also includes interlayer dielectric 1212 between the vias.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a self-assembled monolayer (SAM) film by delivering, to a substrate that comprises a metal region and a dielectric region, a first quantity of difunctional molecules that selectively adhere to the metal region;
   forming a reacted film by delivering a second quantity of diene molecules to active sites of the SAM film, under conditions that promote reaction of the diene molecules with the SAM film;
   grafting a further layer to the reacted film by delivering a third quantity of difunctional molecules to the reacted film, under conditions that promote reaction of the difunctional molecules with the reacted film; and
   cross-linking free ends of the further layer by delivering a fourth quantity of trifunctional molecules to the further layer, under conditions that promote reaction of the trifunctional molecules with the further layer.

2. The method of claim 1, wherein the difunctional molecules are selected from a list consisting of: dithiols (HS—R—SH), disilanes (Cl$_3$Si—R—SiCl$_3$), dialkenes (C=C—R—C=C), dialkanoic acids (HOOC—R—COOH), and diphosphonic acids (H$_3$PO$_3$—R—PO$_3$H$_3$).

3. The method of claim 1, further comprising repeating steps of forming a reacted film and grafting a further layer at least one more time before the step of cross-linking free ends of the further layer.

4. The method of claim 3, comprising repeating steps of forming a reacted film and grafting a further layer until a thickness of an accumulated film exceeds a width of the metal region.

5. The method of claim 4, wherein the width of the metal region is less than 14 nm.

6. The method of claim 5, wherein the thickness of the film is greater than 10 nm and the film does not overlap the dielectric region.

7. The method of claim 1, wherein a gap in the film is fully-aligned to the dielectric region and the film completely covers the metal region.

* * * * *